United States Patent
Kamp et al.

(10) Patent No.: US 12,237,203 B2
(45) Date of Patent: Feb. 25, 2025

(54) SYSTEM, METHOD, AND USER INTERFACE FOR EDGE RING WEAR COMPENSATION

(71) Applicant: Lam Research Corporation, Fremont, CA (US)

(72) Inventors: Tom A. Kamp, San Jose, CA (US); Carlos Leal-Verdugo, Richmond, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/991,193

(22) Filed: Nov. 21, 2022

(65) Prior Publication Data
US 2023/0083737 A1    Mar. 16, 2023

Related U.S. Application Data (62) Division of application No. 16/769,681, filed as application No. PCT/US2018/063385 on Nov. 30, 2018, now Pat. No. 11,538,713.

(Continued)

(51) Int. Cl.
*H01L 21/687* (2006.01)
*H01L 21/67* (2006.01)

(52) U.S. Cl.
CPC .. *H01L 21/68721* (2013.01); *H01L 21/67288* (2013.01)

(58) Field of Classification Search
CPC ......... H01L 21/68721; H01L 21/67288; H01L 21/68735; H01L 21/68742;

(Continued)

(56) References Cited

U.S. PATENT DOCUMENTS 10,184,786 B2 *   1/2019   Matsudo ................. G01K 5/48
10,186,402 B2 *   1/2019   Kamata ............... H01J 37/3299
(Continued)

FOREIGN PATENT DOCUMENTS

CN         1316095 A   *   10/2001        H01J 37/32623
CN     107393797 A   *   11/2017          C23C 16/4404
(Continued)

OTHER PUBLICATIONS

International Search Report and Written Opinion of the ISA issued in PCT/US2018/063385, mailed Mar. 18, 2019; ISA/KR.

(Continued)

*Primary Examiner* — Mohammed Shamsuzzaman (57) ABSTRACT

A method for adjusting a height of an edge ring arranged around an outer portion of a substrate support includes receiving at least one input indicative of one or more erosion rates of the edge ring. The at least one input includes a plurality of erosion rates for respective usage periods of a substrate processing system. The method further includes determining at least one erosion rate of the edge ring using the plurality of erosion rates for the respective usage periods, monitoring an overall usage of the edge ring and storing the overall usage of the edge ring in a memory, calculating an amount of erosion of the edge ring based on the determined at least one erosion rate and the overall usage of the edge ring, and adjusting the height of the edge ring based on the calculated amount of erosion to compensate for the calculated amount of erosion.

8 Claims, 11 Drawing Sheets

Related U.S. Application Data (60) Provisional application No. 62/594,861, filed on Dec. 5, 2017.

(58) Field of Classification Search
CPC .............. H01L 21/67253; H01L 21/02; H01L 21/67276; H01J 37/32623; H01J 37/32642; H01J 37/32926; H01J 37/3299
See application file for complete search history.

(56) References Cited

U.S. PATENT DOCUMENTS

| | | | | |
|---|---|---|---|---|
| 10,504,702 | B2* | 12/2019 | Luere | H01J 37/32082 |
| 10,770,321 | B2* | 9/2020 | Chiang | H01L 21/67253 |
| 10,903,050 | B2* | 1/2021 | Albarede | H01L 21/67253 |
| 11,257,691 | B2* | 2/2022 | Tanikawa | H01L 21/67069 |
| 11,264,207 | B2* | 3/2022 | Kim | H01J 37/32009 |
| 11,264,291 | B2* | 3/2022 | Yang | H01L 21/6831 |
| 11,605,546 | B2* | 3/2023 | McChesney | H01L 21/67069 |
| 2008/0006938 | A1* | 1/2008 | Patti | H01L 23/585 |
| | | | | 257/E21.705 |
| 2011/0235056 | A1* | 9/2011 | Matsudo | G01B 9/0209 |
| | | | | 356/630 |
| 2014/0034243 | A1 | 2/2014 | Dhindsa et al. | |
| 2015/0075970 | A1* | 3/2015 | Miller | C23C 14/35 |
| | | | | 204/192.12 |
| 2015/0168130 | A1* | 6/2015 | Matsudo | G01B 9/02021 |
| | | | | 374/161 |
| 2016/0211165 | A1* | 7/2016 | McChesney | H01L 21/67069 |
| 2016/0216185 | A1 | 7/2016 | Gottscho | |
| 2017/0053819 | A1* | 2/2017 | Richardson | H01J 37/3244 |
| 2017/0213758 | A1* | 7/2017 | Rice | H01J 37/32082 |
| 2017/0236743 | A1* | 8/2017 | Severson | H01L 21/68742 |
| | | | | 414/806 |
| 2017/0253974 | A1* | 9/2017 | Canniff | C23C 16/458 |
| 2017/0256463 | A1 | 9/2017 | Bailey, III et al. | |
| 2017/0338140 | A1* | 11/2017 | Pape | C23C 16/45544 |
| 2018/0061696 | A1* | 3/2018 | D'Ambra | G01N 21/64 |
| 2019/0371581 | A1* | 12/2019 | Wang | H01J 37/32458 |
| 2020/0335368 | A1* | 10/2020 | Pan | H01L 21/67259 |

FOREIGN PATENT DOCUMENTS

| | | | | |
|---|---|---|---|---|
| CN | 107768225 | A * | 3/2018 | ............. G01D 21/00 |
| JP | H10298768 | A | 11/1998 | |
| JP | 2001230239 | A | 8/2001 | |
| JP | 2002176030 | A | 6/2002 | |
| JP | 2008042005 | A | 2/2008 | |
| JP | 2008244274 | A | 10/2008 | |
| JP | 2009180722 | A | 8/2009 | |
| JP | 2017092435 | A | 5/2017 | |
| TW | 201237923 | A | 9/2012 | |
| TW | 201741905 | A | 12/2017 | |
| TW | 202009972 | A * | 3/2020 | ........ H01J 37/32642 |
| TW | 202137276 | A * | 10/2021 | |
| WO | WO-2019112903 | A1 * | 6/2019 | ........ H01J 37/32623 |
| WO | WO-2021194470 | A1 * | 9/2021 | ........ H01J 37/32082 |

OTHER PUBLICATIONS

Office Action dated Apr. 18, 2022 and Translation corresponding to Taiwanese Patent Application No. 107143382, 15 pages.
U.S. Appl. No. 16/769,681, filed Jun. 4, 2020, Tom A. Kamp et al.
Decision to Grant a Patent from corresponding Japanese Application No. 2020-530558, dated Jun. 21, 2023.
Office Action from corresponding Taiwanese Application No. 107143382, dated Mar. 27, 2024.
Decision for Grant of Patent from corresponding Korean Application No. 10-2020-7019238, dated May 13, 2024.
Office Action from corresponding Japanese Application No. 2023-122092, dated Sep. 10, 2024.

* cited by examiner

SYSTEM, METHOD, AND USER INTERFACE FOR EDGE RING WEAR COMPENSATION

CROSS-REFERENCE TO RELATED APPLICATIONS

The present disclosure is a divisional of U.S. patent application Ser. No. 16/769,681, filed on Jun. 4, 2020, which is a National Stage of International Application No. PCT/US2018/063385, filed on Nov. 30, 2018, which claims the benefit of U.S. Provisional Application No. 62/594,861, filed on Dec. 5, 2017. The entire disclosures of the applications referenced above are incorporated herein by reference.

FIELD

The present disclosure relates to substrate processing, and more particularly to systems and methods for compensating for wear of a tunable edge ring in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures may be introduced into the processing chamber and plasma may be used to initiate chemical reactions.

The substrate support may include a ceramic layer arranged to support a substrate. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc.

SUMMARY

A controller for adjusting a height of an edge ring in a substrate processing system includes an edge ring wear calculation module configured to receive at least one input indicative of one or more erosion rates of the edge ring, calculate at least one erosion rate of the edge ring based on the at least one input, and calculate an amount of erosion of the edge ring based on the at least one erosion rate. An actuator control module is configured to adjust the height of the edge ring based on the amount of erosion as calculated by the edge ring wear calculation module.

In other features, the at least one input includes an erosion rate as input by a user. The at least one input includes a plurality of erosion rates for respective usage periods of the substrate processing system. The at least one input includes information indicating a type and duration of processing performed in the substrate processing system. The at least one input includes calibration data indicating at least one of the height, a thickness, and a position of the edge ring.

In other features, to calculate the at least one erosion rate, the edge ring wear calculation module is configured to calculate a plurality of erosion rates in respective usage periods of the substrate processing system. To calculate the amount of erosion of the edge ring, the edge ring wear calculation module is configured to calculate the amount of erosion based on the plurality of erosion rates as calculated in the respective usage periods. Each of the plurality of erosion rates is different for the respective usage periods. The edge ring wear calculation module is configured to calculate the plurality of erosion rates using a lookup table that indexes erosion rates to usage periods. The edge ring wear calculation module is configured to calculate the plurality of erosion rates using a model.

In other features, a system includes the controller and further includes user interface configured to receive the at least one input. The user interface is configured to receive, as the at least one input, a plurality of erosion rates. The user interface includes a display configured to display the amount of erosion as calculated by the edge ring wear calculation module.

A method for adjusting a height of an edge ring in a substrate processing system includes receiving at least one input indicative of one or more erosion rates of the edge ring, calculating at least one erosion rate of the edge ring based on the at least one input, calculating an amount of erosion of the edge ring based on the at least one erosion rate, and adjusting the height of the edge ring based on the calculated amount of erosion.

In other features, the at least one input includes at least one of an erosion rate as input by a user, a plurality of erosion rates for respective usage periods of the substrate processing system, information indicating a type and duration of processing performed in the substrate processing system, and calibration data indicating at least one of the height, a thickness, and a position of the edge ring.

In other features, calculating the at least one erosion rate includes calculating a plurality of erosion rates in respective usage periods of the substrate processing system. Calculating the amount of erosion of the edge ring includes calculating the amount of erosion based on the plurality of erosion rates as calculated in the respective usage periods. Each of the plurality of erosion rates is different for the respective usage periods. The method further includes calculating the plurality of erosion rates using at least one of a lookup table that indexes erosion rates to usage periods and a model. The method further includes receiving the at least one input via a user interface.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate support in a substrate processing system may include an edge ring. An upper surface of the edge ring may extend above an upper surface of the substrate support, causing the upper surface of the substrate support (and, in some examples, an upper surface of a substrate arranged on the substrate support) to be recessed relative to the edge ring. This recess may be referred to as a pocket. A distance between the upper surface of the edge ring and the upper surface of the substrate may be referred to as a "pocket depth" or "pocket height." Generally, the pocket depth is fixed according to a height of the edge ring relative to the upper surface of the substrate.

Some aspects of etch processing may vary due to characteristics of the substrate processing system, the substrate, gas mixtures, etc. For example, flow patterns, and therefore an etch rate and etch uniformity, may vary according to the pocket depth of the edge ring, edge ring geometry (i.e., shape), etc. In some example processes, overall etch rates vary as the distance between the upper surface of the substrate and the bottom surface of the gas distribution device increases. Further, the etch rates may vary from the center of the substrate to an outer perimeter of the substrate. For example, at an outer perimeter of the substrate, sheath bending and ion tilt can cause shallow trench isolation (STI) tilt, and chemical loading associated with reactive species (e.g., etchants and/or deposition precursors) can cause hard mask critical dimension roll off. Varying the configuration of the edge ring (e.g., including edge ring height and/or geometry) may modify the gas velocity profile across the surface of the substrate.

Portions of the edge ring may wear (i.e., erode) over time as a result of exposure to plasma and other process materials during substrate processing. Accordingly, the edge ring may be raised to compensate for an estimated amount of wear experienced by the edge ring. For example, the edge ring may be coupled to an actuator configured to raise and lower the edge ring in response to a controller, user interface, etc. In systems that do not include a mechanism for directly measuring the erosion of the edge ring (e.g., a sensor, camera, etc.), the erosion of the edge ring may be estimated.

Edge ring wear compensation systems and methods according to the principles of the present disclosure estimate the erosion of the edge ring and adjust a height of the edge ring to compensate for the erosion accordingly. For example, the edge ring may have one or more associated erosion rates. In some examples, the erosion rate may vary over time (e.g., in radio frequency (RF) hours), may vary based on processes being performed, etc. In other words, the erosion rate may not be linear due to a variable sensitivity to erosion. Accordingly, the systems and methods described herein estimate the erosion based on various operation parameters and adjust the height of the edge ring based on the estimated erosion. In one example, the erosion may be estimated by determining different erosion rates (e.g., in mm/hr, µm/hr, etc.) for respective periods (RF hours, or RFh) to calculate an amount of erosion for each period. The total erosion can then be calculated by combining the calculated amount of erosion for each of the periods.

Figure 1:
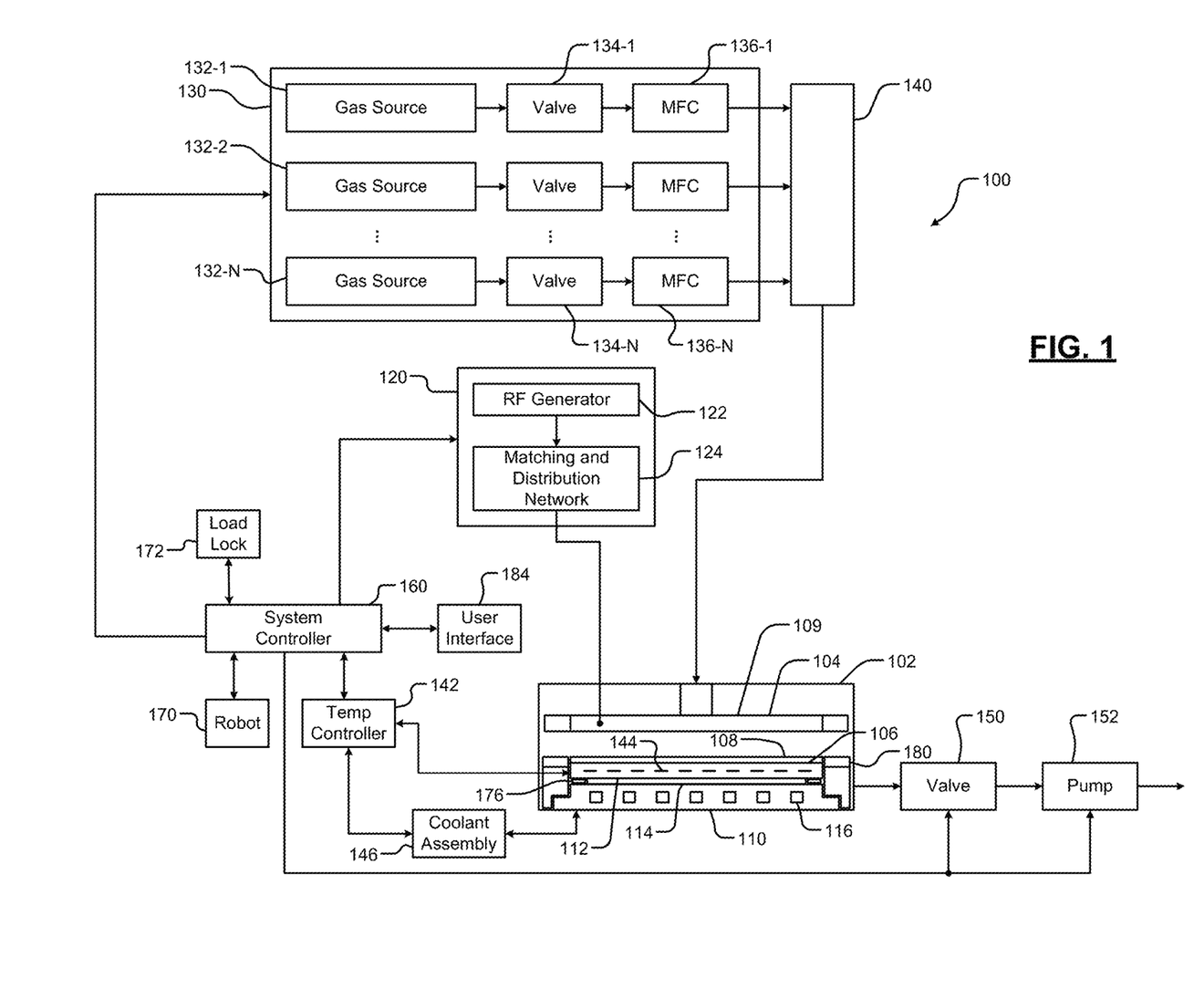
FIG. 1 is a functional block diagram of an example processing chamber according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more etch gases, carrier gases, inert gases, etc., and mixtures thereof. The gas sources may also supply purge gas. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes an edge ring 180. The edge ring 180 according to the principles of the present disclosure is moveable (e.g., moveable upward and downward in a vertical direction) relative to the substrate 108. For example, the edge ring 180 may be controlled via an actuator responsive to the controller 176. In some examples, a user may input control parameters (e.g., erosion rates) to the controller 176 via a user interface 184, which may include one or more input mechanisms, a display, etc.

Figure 2A:
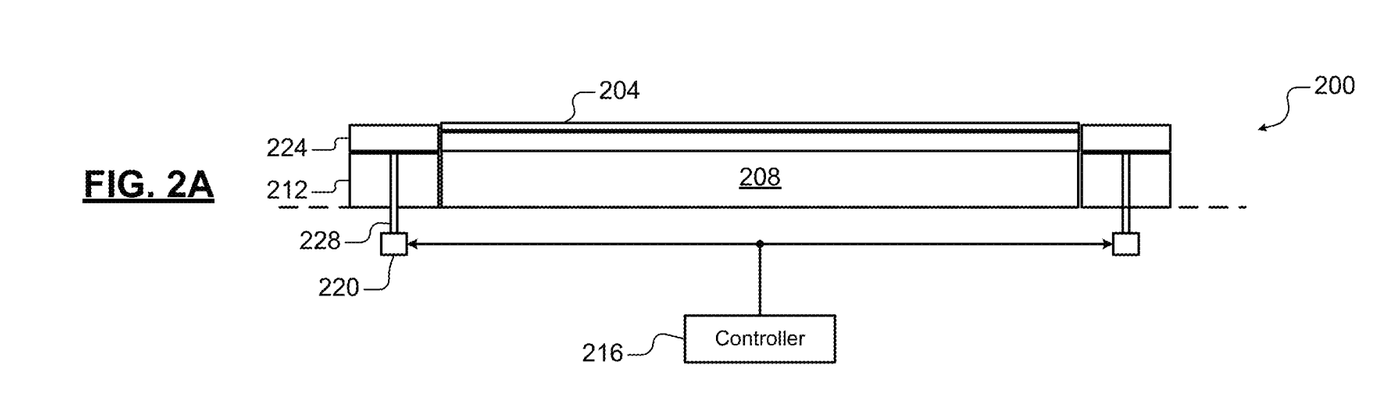
FIG. 2A shows an example movable edge ring in a lowered position according to the present disclosure.
Figure 2B:
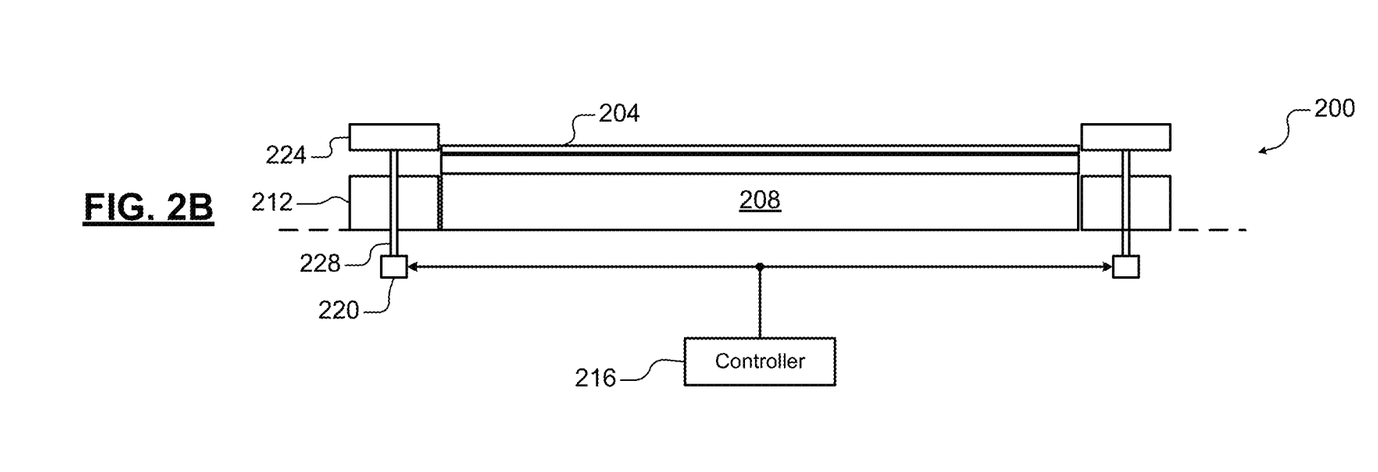
FIG. 2B shows an example movable edge ring in a raised position according to the present disclosure.

Referring now to FIGS. 2A and 2B, a substrate support 200 having a substrate 204 arranged thereon according to the principles of the present disclosure is shown. The substrate support 200 may include a base or pedestal having an inner portion (e.g., corresponding to an ESC) 208 and an outer portion 212. In examples, the outer portion 212 may be independent from, and moveable in relation to, the inner portion 208. The substrate 204 is arranged on the inner portion 208 for processing. A controller 216 (e.g., corresponding to the system controller 160) communicates with one or more actuators 220 to selectively raise and lower edge rings 224 to adjust a pocket depth of the support 200. For example only, the edge ring 224 is shown in a fully lowered position in FIG. 2A and in an example fully raised position in FIG. 2B. As shown, the actuators 220 correspond to pin actuators configured to selectively extend and retract pins 228 in a vertical direction. Other suitable types of actuators may be used in other examples. For example only, the edge ring 224 corresponds to a ceramic or quartz edge ring. In FIG. 2A, the controller 216 communicates with the actuators 220 to directly raise and lower the edge ring 224 via the pins 228. In some examples, the inner portion 208 is moveable relative to the edge ring 224. The edge ring 224 may have one or more associated erosion rates as described below in more detail.

Figure 3A:
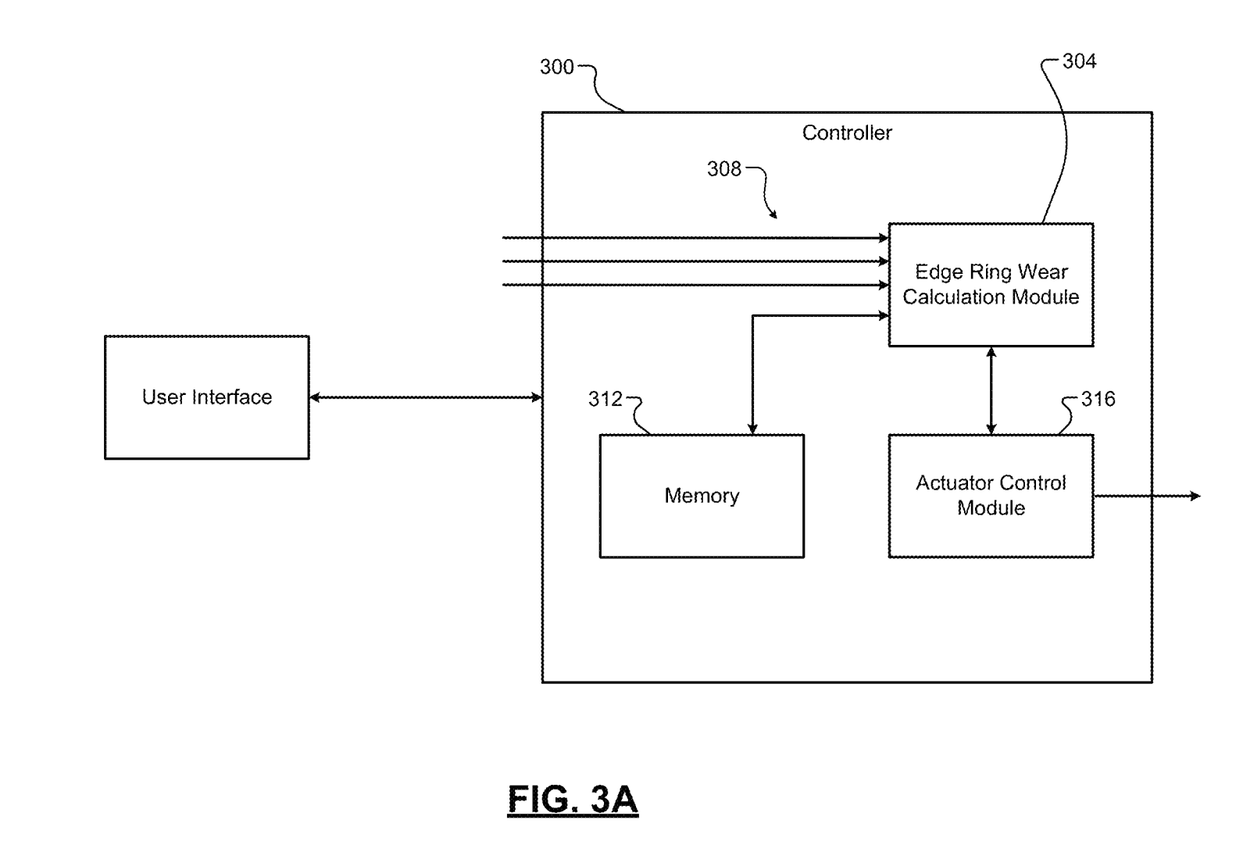
FIG. 3A shows an example controller according to the present disclosure.

Referring now to FIG. 3A, an example controller 300 includes an edge ring wear calculation module 304 configured to calculate an amount of wear (e.g., in mm or μm) of an edge ring. For example, the edge ring wear calculation module 304 receives one or more inputs 308 including, but not limited to, calibration data indicating an initial edge ring thickness, height, position, etc. of the edge ring, process parameters (e.g., materials used, type of process, information indicating a duration of a process, such as start and end times, temperatures within the processing chamber, etc.), chamber characteristics, user defined variables, user inputs, sensor measurements, etc. The user inputs may include one or more erosion rates. The edge ring wear calculation module 304 calculates the edge ring wear based on the received inputs 308. For example, the edge ring wear calculation module 304 may calculate the edge ring wear according to the erosion rates (e.g., as input by a user via user interface 310, stored in memory 312, calculated based on various process parameters, and/or combinations thereof) in respective processing periods and durations of the respective processing periods (e.g., in RF hours). The data may include, but is not limited to, one or more lookup tables indexing the erosion rates to usage periods, a model to be executed by the edge ring wear calculation module 304, etc.

The edge ring wear calculation module 304 is further configured to calculate an amount to adjust a height of the edge ring (i.e., edge ring adjustment data) based on the calculated wear and to provide the edge ring adjustment data to an actuator control module 316. The actuator control module 316 outputs one or more control signals based on the edge ring adjustment data to control respective actuators. For example, the control signals may be provided to actuators such as the actuators 220 described in FIGS. 2A and 2B.

Figure 3B:
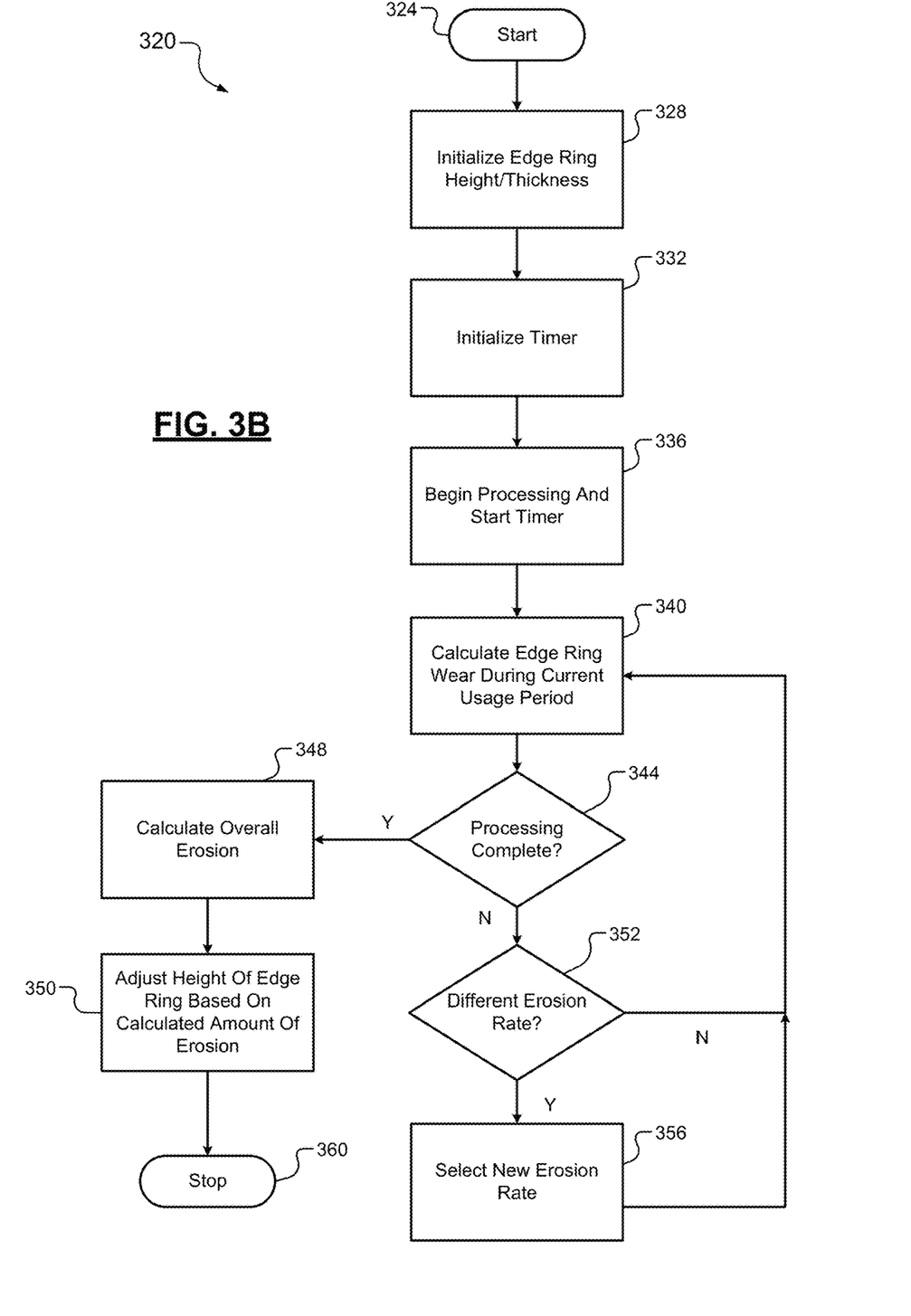
FIG. 3B shows an example method of determining an amount of wear of an edge ring according to the present disclosure.

Referring now to FIG. 3B, an example method 320 for calculating an amount of edge ring wear begins at 324. At 328, the method 320 (e.g., the edge ring wear calculation module 304) initializes a height and/or thickness of an edge ring in a processing chamber. For example, the edge ring wear calculation module 304 may determine an initial height of the edge ring based on a sensor measurement or physical measurement of the thickness of the edge ring during installation, maintenance, etc. At 332, the method 320 initializes a timer or counter to monitor a duration, in RF hours, of processing performed in the chamber. At 336, substrate processing within the chamber begins and the timer is started.

At 340, the method 320 (e.g., the edge ring wear calculation module 304) calculates edge ring wear during a current usage period in accordance with an associated erosion rate. At 344, the method 320 determines whether processing is complete. If true, the method 320 continues to 348. If false, the method 320 continues to 352. At 352, the method 320 (e.g., the edge ring wear calculation module 304) determines whether to select a different erosion rate. For example, the edge ring wear calculation module 304 may select a different erosion rate upon transitioning to a different usage period (e.g., in response to the timer exceeding one or more RF hour thresholds, such as 50 RF hours, 200 RF hours, etc.). If true, the method 320 continues to 356. If false, the method 320 continues to 340. At 356, the method 320 (e.g., the edge ring wear calculation module 304) selects a new erosion rate and continues to 340.

At 348, the method 320 (e.g., the edge ring wear calculation module 304) calculates an overall (e.g., cumulative) amount of erosion of the edge ring in accordance with the edge ring wear calculated in each usage period at 340. In some examples, a height of the edge ring is adjusted based on the calculated amount of erosion at 350. For example, the edge ring may be raised an amount equal to the amount of erosion, an amount equal to an amount of erosion that occurred since a last time the edge ring was raised, etc. The method 320 ends at 360.

Figure 4A:
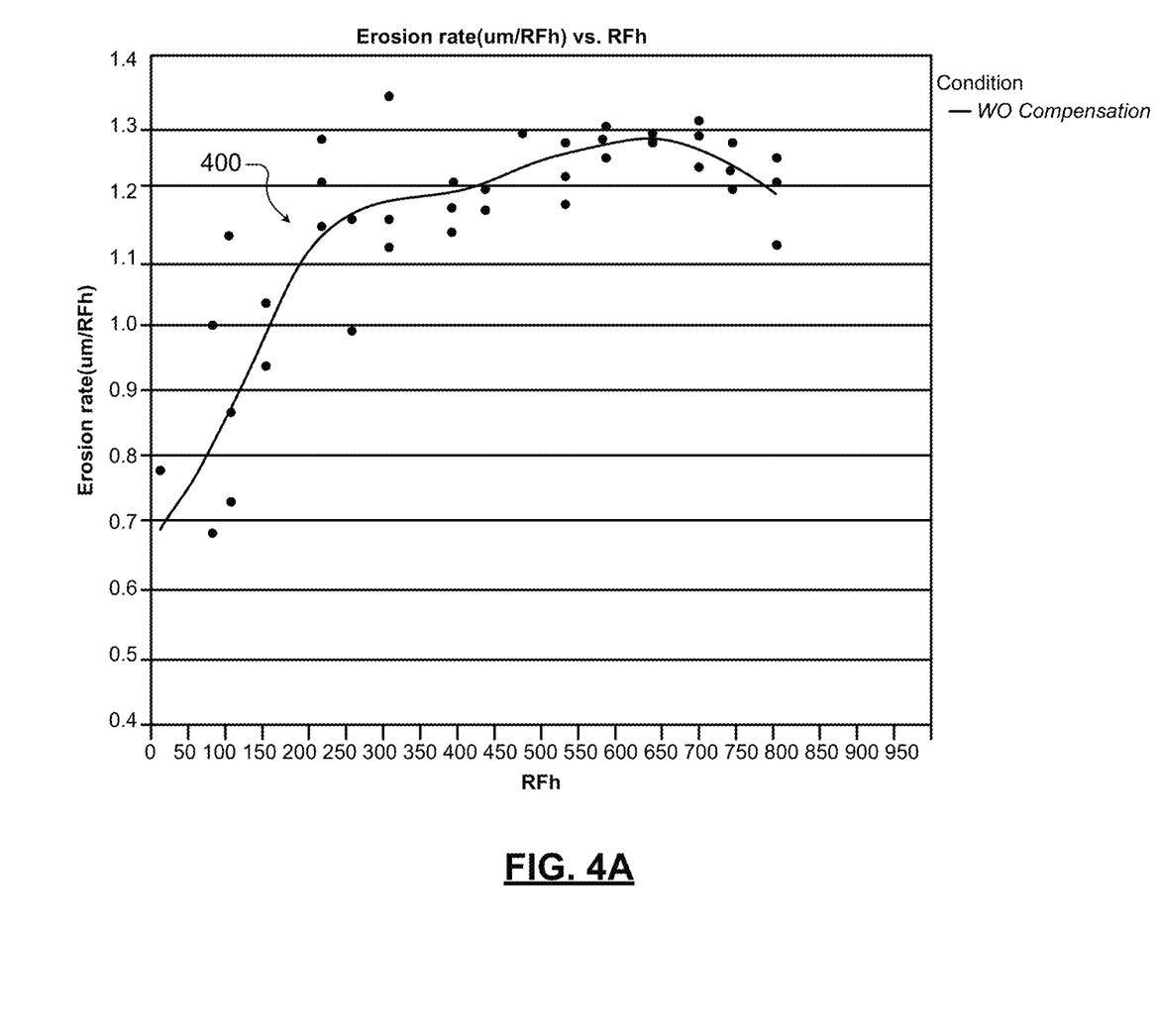
FIGS. 4A, 4B, and 4C show example erosion rates and erosion calculation according to the present disclosure.
Figure 4B:
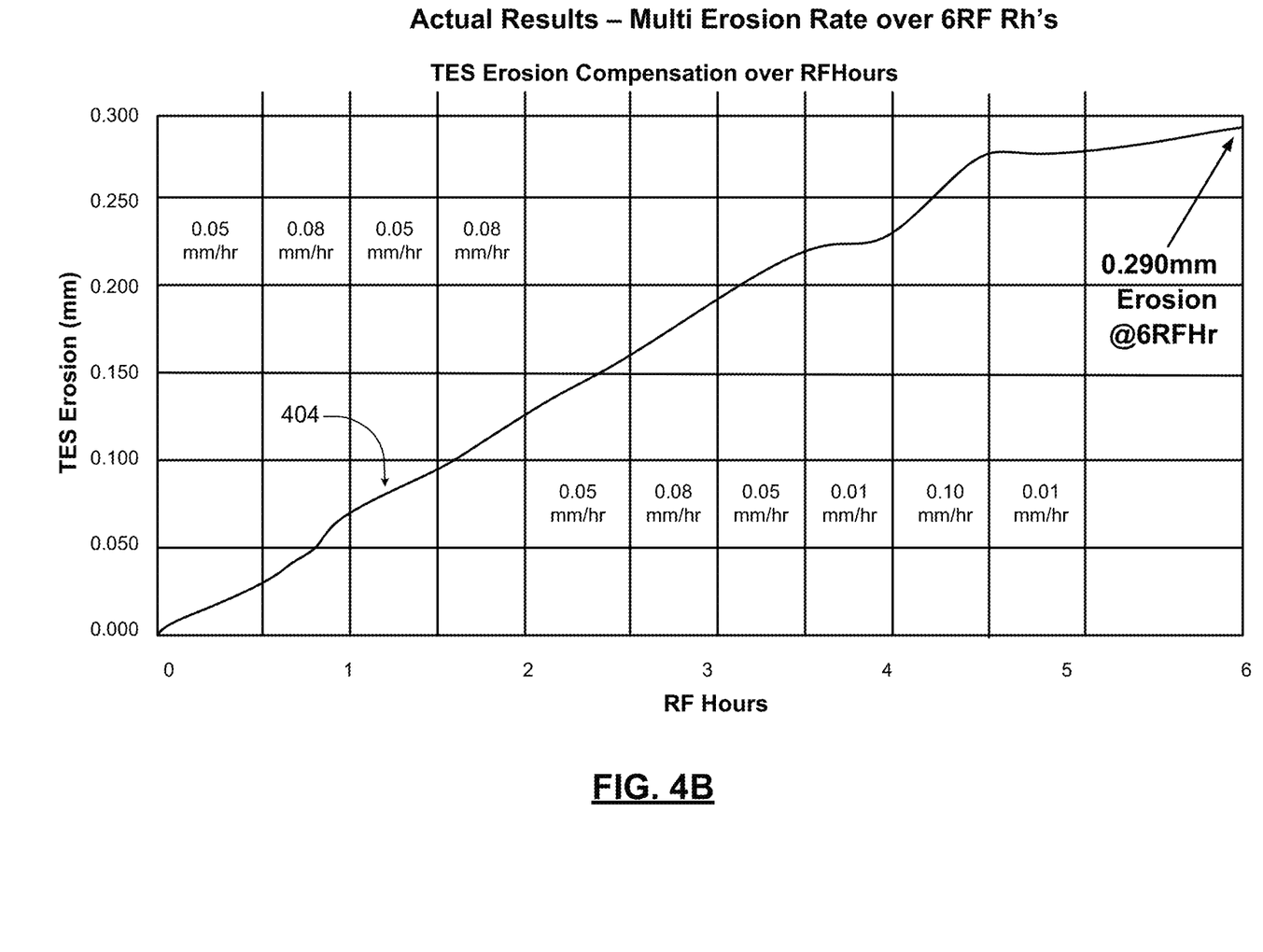
Figure 4C:
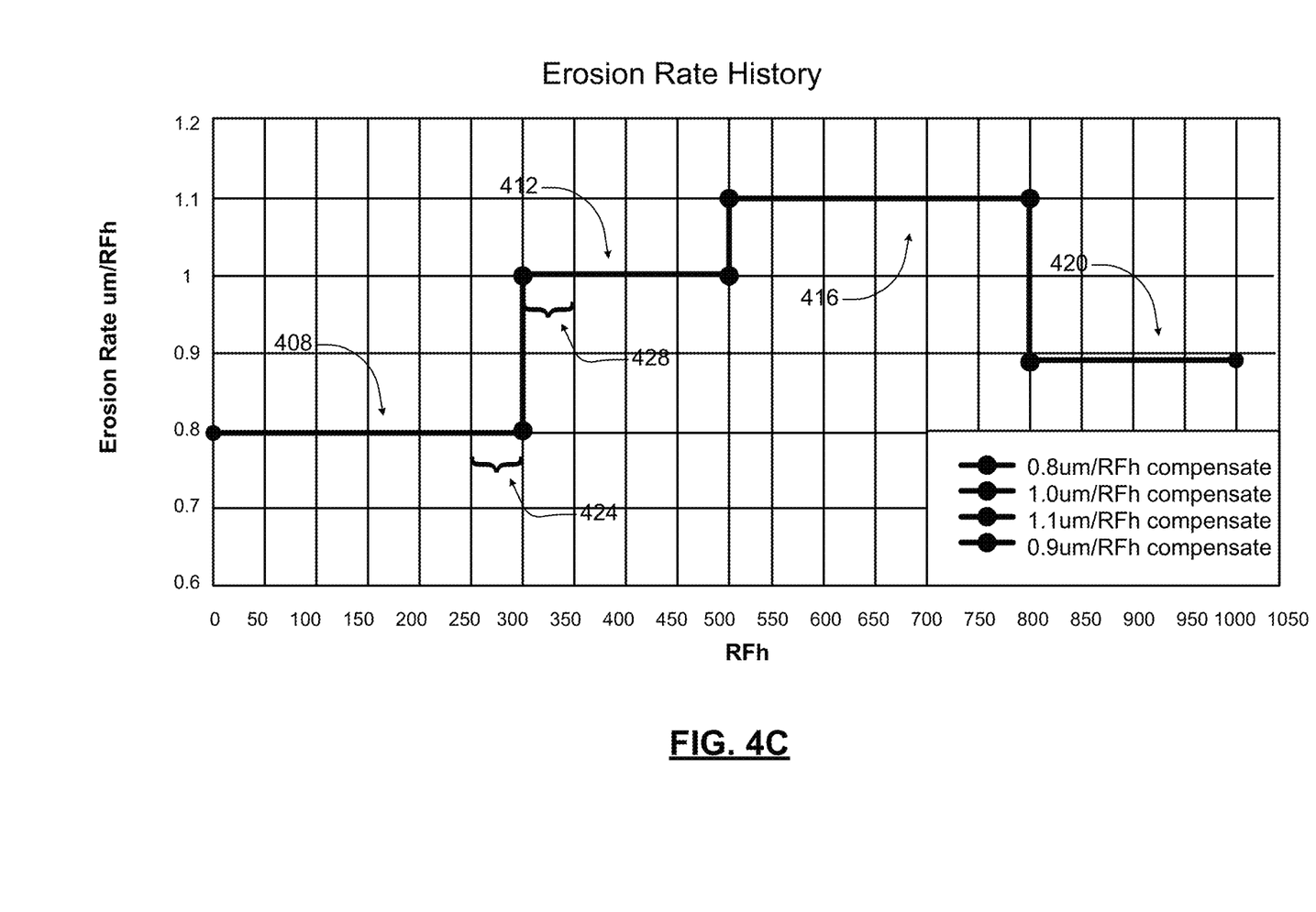

Referring now to FIGS. 4A, 4B, and 4C, example erosion rates and wear compensation are shown. In FIG. 4A, an example erosion rate 400 (in μm/RFh) is shown over 1000 RF hours. For example, the erosion rate 400 may be calculated by measuring respective amounts of erosion on one or more edge rings (e.g., using sensors in a test chamber, physical measurements, etc.) over time. As shown, the erosion rate 400 is substantially non-linear. For example, the erosion rate 400 may sharply increase from 0.7 μm/RFh in a first usage period (e.g., from 0 to 250 RF hours of use) and vary between 1.1 and 1.3 μm/RFh in a second usage period (e.g., from 250 to 800 hours of use).

In FIG. 4B, an example erosion rate 404 (in mm/RFh) is shown over 6 RF hours. As shown, the erosion rate 404 may vary over even relatively small usage periods. For example, although the erosion rate 404 may be substantially linear in a usage period from 0 to 3 or 3.5 RF hours, the erosion rate 404 may vary in each half-hour period over that same usage period (e.g., from 0.05 mm/RFh to 0.08/RFh).

Accordingly, the edge ring wear calculation module 304 determines an amount of wear of the edge ring based on different erosion rates for respective usage periods. For example, the edge ring wear calculation module 304 may be configured to determine (and adjust, for wear calculation) the erosion rate periodically (e.g., for each half hour usage period, hundred hour usage period, non-uniform predetermined usage periods, etc.), using a model that adjusts one or more base erosion rates in accordance with process parameters, in response to user inputs, etc. Respective erosion rates may be calculated by the edge ring wear calculation module 304, stored in the memory 312 to be retrieved by the edge ring wear calculation module 304, input by a user at the beginning of or during a process, etc.

In examples where the erosion rate is determined for uniform and/or non-uniform predetermined usage periods, the usage periods may be determined based on previously observed/measured erosion rates as shown in FIGS. 4A and 4B. For example, a usage period having an associated erosion rate may correspond to a period having an erosion rate that does not vary by more than a predetermined variance amount (e.g., by more than 0.1, 0.2 μm/RFh, etc.). In another example, usage periods may be defined based on average erosion rates within adjacent usage periods. For example, if an average erosion rate within a sliding window of time (e.g., 50 RFh) differs by more than a predetermined amount (e.g., 0.1 μm/RFh, 0.2 μm/RFh, etc.) from an average erosion rate within a previous position of the sliding window (e.g., offset by 5 RFh, 10 RFh, etc.), a usage period having the associated erosion rate may be defined accordingly.

For example, as shown in FIG. 4C, a first usage period 408 may be associated with a first erosion rate of 0.8 μm/RFh (amounting to 0.8*300, or 240 microns, over the first usage period 408). Conversely, a second usage period 412 may be associated with a second erosion rate of 1.0 μm/RFh (amounting to a sum of the erosion amount in the first usage period (240 microns) and an erosion amount of the second usage period 412 (1.0*200, or 200 microns) for a cumulative erosion of 440 microns), a third usage period 416 may be associated with a third erosion rate of 1.1 μm/RFh (amounting to a cumulative erosion of 770 microns for the first usage period 408, the second usage period 412, and the third usage period 416), and a fourth usage period 420 may be associated with a fourth erosion rate of 0.9 μm/RFh (amounting to a cumulative erosion of 950 microns for 1000 RFh). The associated erosion rates may correspond to average erosion rates during the respective usage periods.

In one example, transitions between adjacent usage periods and their respective erosion rates may be defined in accordance with a change in average erosion rates over a sliding window of 50 RF hours. For example, an average erosion rate in a sliding window having a duration of 50 RF hours as shown at 424 may be within 0.1 μm/RFh of the average erosion rate of 0.8 μm/RFh for the first usage period 408. Conversely, an average erosion rate in the sliding window as shown at 428 may have an average erosion rate of 1.0 μm/RFh. Accordingly, a transition from the first usage period 408 having the first erosion rate to the second usage period 412 having the second erosion rate may be defined at 300 RF hours.

In this manner, the different erosion rates in respective usage periods correspond to a compensation sequence that is applied to the control of the edge ring position over a lifetime of the edge ring. For example, the erosion rates and associated usage periods are stored in the memory 312. In one example, the erosion rates are stored as a table indexing erosion rates to respective usage periods. One or both of the erosion rates and the usage periods may be input by a user.

The edge ring wear calculation module 304 is further configured to monitor an overall usage (i.e., cumulative, in RF hours) of the edge ring. For example, the edge ring wear calculation module 304 may include a timer or counter that monitors the usage and stores the overall usage of the edge ring accordingly. When calculating erosion, the edge ring wear calculation module 304 calculates the overall (i.e., cumulative) erosion according to overall usage and the different erosion rates in respective usage periods. For example, if the overall usage is 150 RF hours, the erosion may correspond to 0.8 μm/RFh×150 RF hours. Conversely, if the overall usage is 400 RF hours, the erosion may correspond to 0.8 μm/RFh×300 RF hours+1.0 μm/RFh×100 RF hours.

Referring now to FIGS. 5A, 5B, 5C, and 5D, an example user interface 500 (e.g., corresponding to the user interface 184 of FIG. 1, the user interface 310 of FIG. 3A, etc.) for inputting erosion rates is shown. For example, a user may disable erosion rate calculation at 504, select a single (e.g., linear) erosion rate at 508 and enter the selected erosion rate at 512, or select multiple erosion rates (e.g., a non-linear multi-rate) at 516. If multiple erosion rates are selected, the user may input each erosion rate and a start time (in RF hours) of an associated usage period at 520. A calculated erosion amount for each usage period may be displayed at 524 (e.g., in real time). The user may add additional rows (i.e., usage periods, by start time, and associated erosion rates) and/or remove rows. The edge ring wear calculation module 304 calculates the erosion based on the input erosion rate for each period. For example, as shown, the edge ring wear calculation module 304 calculates erosion for a usage period starting at 0 RF hours in accordance with an erosion rate input at 520. An overall usage may be shown at 528. A calculated erosion amount may be shown at 532. In some examples, overall usage and erosion amounts may be reset (i.e., to zero) at 536.

Figure 5A:
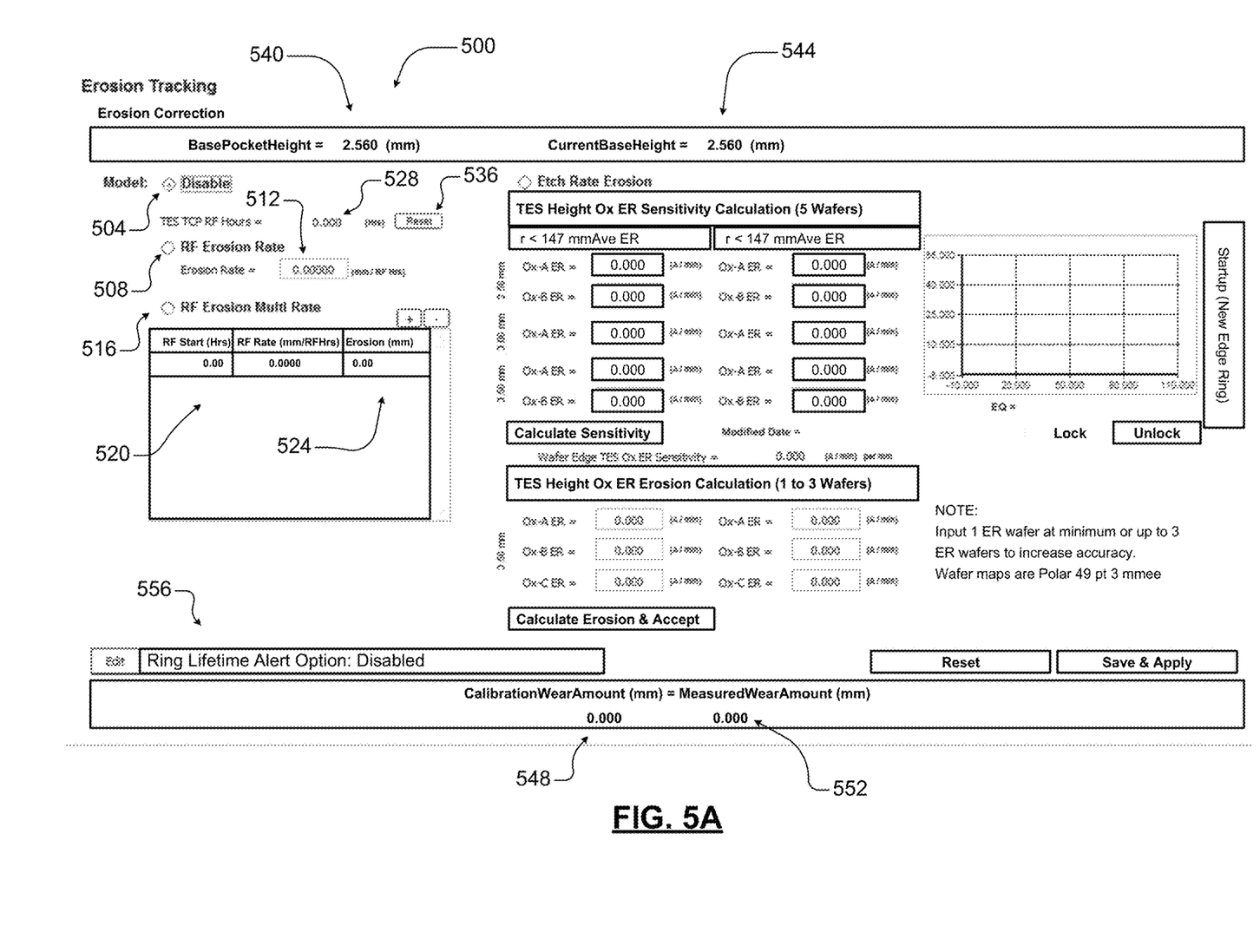
FIGS. 5A, 5B, 5C, and 5D show an example user interface for inputting erosion rates according to the present disclosure.
Figure 5B:
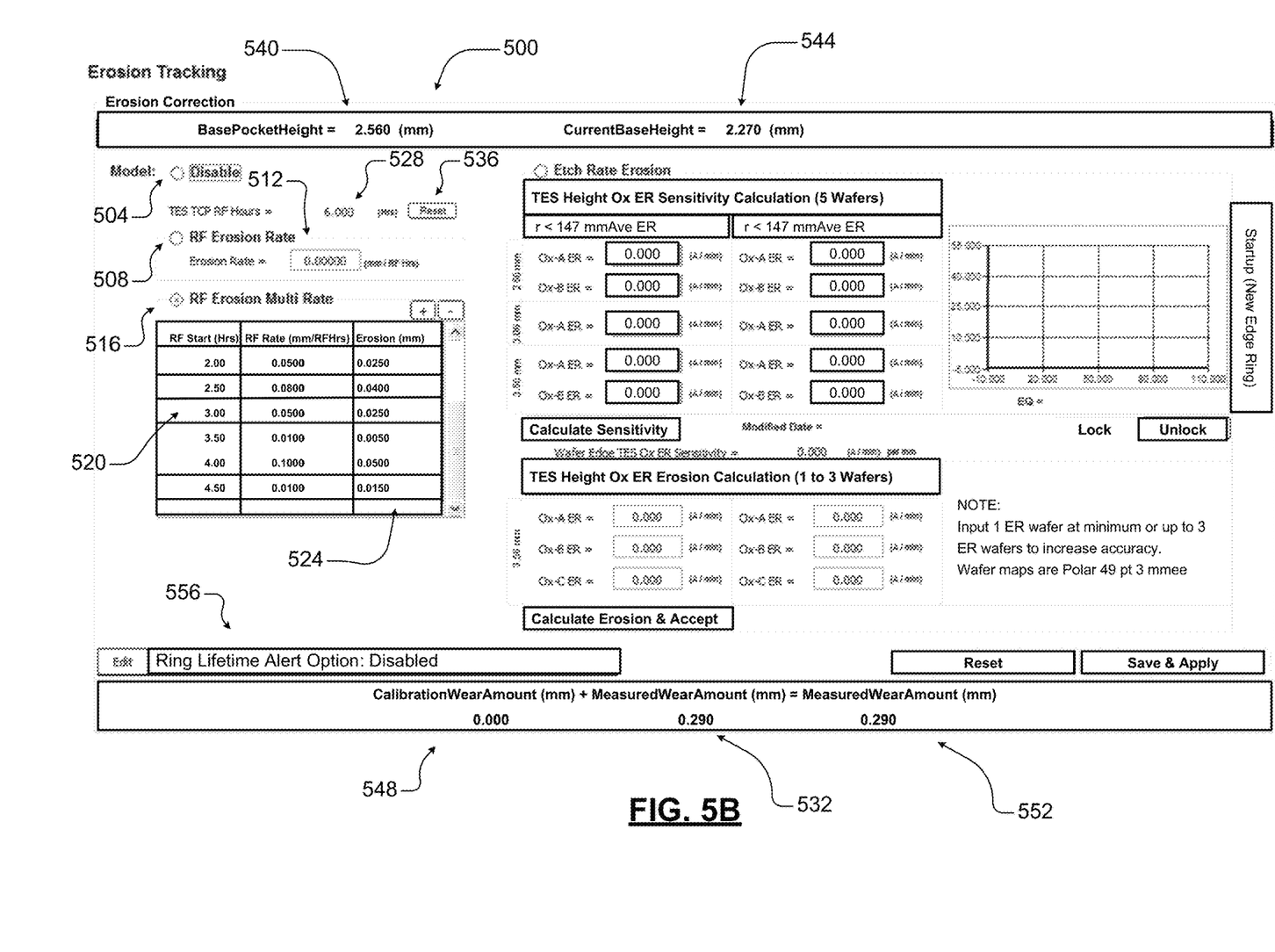

The interface 500 may display a base pocket height at 540. For example, the base pocket height may correspond to a pocket height of the edge ring prior to any adjustment due to erosion. Conversely, a current height may be displayed at 544. The current height corresponds to the base pocket height as reduced by the calculated erosion. As shown in FIG. 5B, the current height is the base pocket height of 2.560 mm minus the calculated erosion of 0.290 mm. In other words, at a next adjustment (e.g., subsequent to a current processing step or recipe), the edge ring wear calculation module 304 may adjust the edge ring 0.290 mm upward to compensate for the calculated erosion.

The interface 500 may also display a calibration wear (erosion) amount at 548. For example, the calibration wear amount may correspond to a physically measured amount of erosion of the edge ring (e.g., as measured during installation, maintenance/cleaning, periodic calibration, etc.), and may account for differences in edge ring thickness due to manufacturing tolerances, previous usage, etc. In other words, at 0 RF hours of usage, the thickness of the edge ring may already be less than some predetermined or expected value. Accordingly, an overall erosion amount 552 may correspond to a sum of the calibration wear amount and the calculated erosion.

Figure 5C:
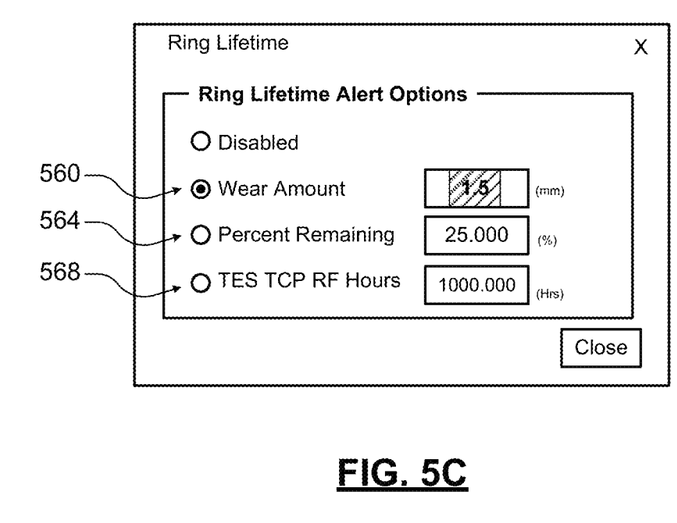

The interface 500 may include an edge ring life time alert as shown at 556, which may be selectively enabled or disabled. For example, the interface 500 may alert the user if the overall erosion amount 552 exceeds a predetermined erosion threshold (e.g., as shown in FIG. 5C, an erosion amount 560 in mm, a percentage 564 of the edge ring eroded or remaining, a total RF hours 568, etc.). In some examples, the erosion threshold may be at least partially based on a thickness of an outer diameter of the edge ring. For example, an inner diameter of the edge ring may wear at a greater rate than an outer diameter of the edge ring. Accordingly, if the edge ring is adjusted upward to compensate for erosion to the inner diameter of the edge ring, the outer diameter of the edge ring may be increasingly raised to a height that is greater than an original (i.e., installed or calibrated) height of the edge ring. In some examples, the raised outer diameter of the edge ring may interfere with the operation of the substrate processing system. For example, the outer diameter of the edge ring may interfere with other structures above the edge ring, robots, etc. In this manner, the edge ring wear calculation module 304 may be further configured to calculate the erosion of the outer diameter of the edge ring and a height of the outer diameter of the edge ring based on an amount that the edge ring has been raised to compensate for erosion, and to activate the ring lifetime alert accordingly.

Figure 5D:
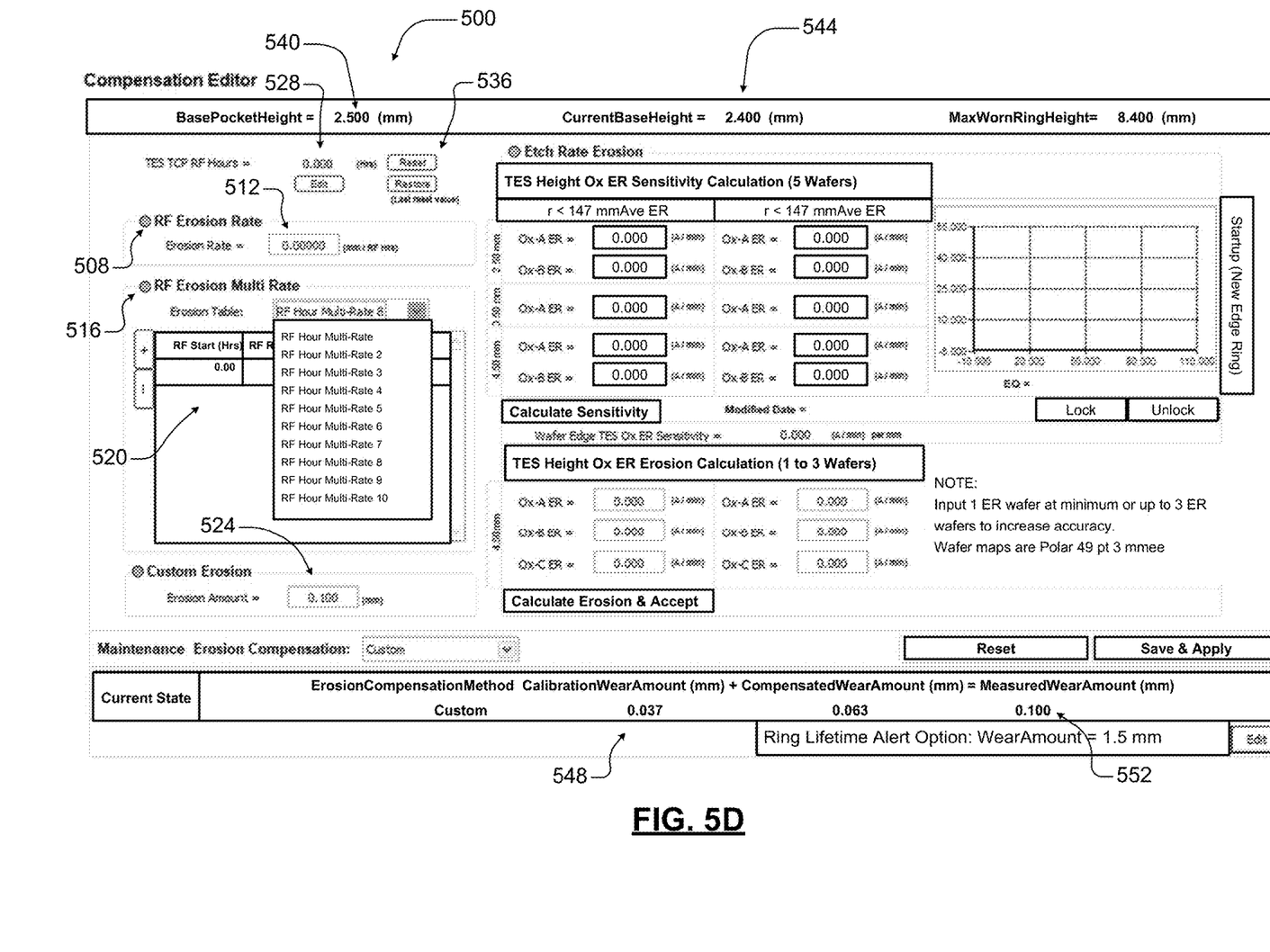

In another example as shown in FIG. 5D, the interface 500 may allow the user to select one of a plurality of multi-rates 572. For example, the multi-rates 572 may correspond to different predetermined and/or customized (i.e., user input or adjusted) multi-rates. Each of the multi-rates 572 may correspond to a different non-linear erosion rate, a different erosion rate model, etc. For example, the user may select a different one of the multi-rates 572 based on a current recipe, substrate type, and/or other process or system parameters. In this manner, the erosion amount may be calculated in accordance with a plurality of different selected linear erosion rates and/or non-linear erosion multi-rates over a total usage period of the edge ring.

Accordingly, erosion compensation (e.g., an amount that the edge ring is adjusted to compensate for the calculated erosion) may be controlled in accordance with a respective recipe. In other words, a first erosion compensation amount may be calculated in accordance with a first erosion multi-rate as selected for a first recipe and the edge ring may be adjusted accordingly. Conversely, a second erosion calculation amount may be calculated in accordance with a second erosion multi-rate as selected for a second recipe. Accordingly, an amount that the edge ring is adjusted may vary based on a selected recipe and/or a specific one of the multi-rates selected for a recipe. Subsequent to the executed recipe and/or adjustment of the edge ring, the erosion rate may return to a default erosion rate for the system or processing tool, prompt the user to input a new erosion rate, etc.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The invention claimed is:

1. A method for adjusting a height of an edge ring arranged around an outer portion of a substrate support in a substrate processing system, the method comprising:
   receiving, from a user interface, at least one input indicative of one or more erosion rates of the edge ring, wherein the at least one input includes a plurality of erosion rates for respective usage periods of the substrate processing system;
   determining, by a controller, at least one erosion rate of the edge ring using the plurality of erosion rates for the respective usage periods, wherein determining the at least one erosion rate includes calculating the plurality of erosion rates in the respective usage periods;
   monitoring an overall usage of the edge ring and storing the overall usage of the edge ring in a memory;
   calculating an amount of erosion of the edge ring based on the determined at least one erosion rate and the overall usage of the edge ring; and
   adjusting the height of the edge ring based on the calculated amount of erosion to compensate for the calculated amount of erosion.

2. The method of claim 1, wherein the at least one input includes an erosion rate as input by a user.

3. The method of claim 1, wherein the at least one input includes information indicating a type and duration of processing performed in the substrate processing system.

4. The method of claim 1, wherein the at least one input includes calibration data indicating at least one of the height, a thickness, and a position of the edge ring.

5. The method of claim 1, wherein calculating the amount of erosion of the edge ring includes calculating the amount of erosion based on the plurality of erosion rates as calculated in the respective usage periods.

6. The method of claim 1, wherein each of the plurality of erosion rates is different for the respective usage periods.

7. The method of claim 1, further comprising calculating the plurality of erosion rates using a lookup table that indexes erosion rates to usage periods.

8. The method of claim 1, further comprising calculating the plurality of erosion rates using a model.

* * * * *